US009347988B2

(12) United States Patent
Akiyama et al.

(10) Patent No.: US 9,347,988 B2
(45) Date of Patent: May 24, 2016

(54) SEMICONDUCTOR TESTING JIG AND SEMICONDUCTOR TESTING METHOD PERFORMED BY USING THE SAME

(71) Applicants: Hajime Akiyama, Tokyo (JP); Akira Okada, Tokyo (JP); Kinya Yamashita, Tokyo (JP)

(72) Inventors: Hajime Akiyama, Tokyo (JP); Akira Okada, Tokyo (JP); Kinya Yamashita, Tokyo (JP)

(73) Assignee: MITSUBISHI ELECTRIC CORPORATION, Tokyo (JP)

( * ) Notice: Subject to any disclaimer, the term of this patent is extended or adjusted under 35 U.S.C. 154(b) by 331 days.

(21) Appl. No.: 13/829,344

(22) Filed: Mar. 14, 2013

(65) Prior Publication Data

US 2014/0009183 A1 Jan. 9, 2014

(30) Foreign Application Priority Data

Jul. 4, 2012 (JP) ................................. 2012-150077

(51) Int. Cl.
*G01R 31/00* (2006.01)
*G01R 31/28* (2006.01)

(52) U.S. Cl.
CPC ........ *G01R 31/2886* (2013.01); *G01R 31/2887* (2013.01); *G01R 31/2889* (2013.01)

(58) Field of Classification Search
CPC ........... G01R 31/2886; G01R 31/2889; G01R 31/2887; G01R 31/31905; G01R 31/2893; G01R 31/2831; G01R 31/2851; G01R 31/2863; G01R 1/0408; G01R 1/04; H01L 21/67132; H01L 21/6835; H01L 2924/0002
USPC ............................ 324/750.16, 750.19, 750.2, 324/756.01–756.03, 756.07, 762.01, 324/762.05; 438/18; 257/48; 361/820
See application file for complete search history.

(56) References Cited

U.S. PATENT DOCUMENTS

| 4,521,995 | A | * | 6/1985 | Sekiya | B24B 37/30 125/35 |
| 4,597,228 | A | * | 7/1986 | Koyama | B24B 7/228 451/289 |
| 4,932,883 | A | * | 6/1990 | Hsia et al. | 439/66 |
| 5,510,721 | A | | 4/1996 | Walles et al. | |

(Continued)

FOREIGN PATENT DOCUMENTS

| CN | 1170461 A | 1/1998 |
| CN | 2582000 Y | 10/2003 |

(Continued)

OTHER PUBLICATIONS

JP 2007/088416 A; English Translation.*

(Continued)

*Primary Examiner* — Patrick Assouad
*Assistant Examiner* — Sean Curtis
(74) *Attorney, Agent, or Firm* — Studebaker & Brackett PC

(57) ABSTRACT

A semiconductor testing jig fixes a measurement target while it is held between a chuck stage and the measurement target. The semiconductor testing jig includes a base on which the measurement target is to be installed and which can be attached to the chuck stage. The base includes: a first main surface to become an installation surface for the measurement target; a second main surface opposite the first main surface and which is to contact the chuck stage; and a porous region containing a porous member. The porous region is provided selectively as seen in plan view, and penetrates through the base from the first main surface toward the second main surface.

11 Claims, 6 Drawing Sheets

(56) References Cited

U.S. PATENT DOCUMENTS

| | | | | |
|---|---|---|---|---|
| 5,938,512 A * | 8/1999 | Takei | ................. | B24B 7/228 451/289 |
| 5,977,785 A * | 11/1999 | Burward-Hoy | .......... | 324/750.09 |
| 6,239,590 B1 * | 5/2001 | Krivy et al. | ............... | 324/750.02 |
| 6,265,888 B1 * | 7/2001 | Hsu | .......................... | 324/750.05 |
| 6,333,638 B1 * | 12/2001 | Fukasawa | .......... | G01R 31/2886 324/754.13 |
| 6,498,505 B2 * | 12/2002 | Liao | ..................... | G01R 1/0483 324/756.01 |
| 6,518,784 B2 * | 2/2003 | Fukasawa | .......... | G01R 31/2886 324/750.25 |
| 6,750,074 B2 * | 6/2004 | Teshirogi | .............. | B24B 37/042 438/33 |
| 6,837,776 B2 | 1/2005 | Shimobeppu et al. | | |
| 6,927,079 B1 * | 8/2005 | Fyfield | ............................ | 438/14 |
| 7,033,857 B2 * | 4/2006 | Munakata | ............. | H01L 21/561 257/678 |
| 7,057,365 B2 * | 6/2006 | Kishida | ........................ | 318/490 |
| 7,109,561 B2 * | 9/2006 | Teshirogi | ............. | B24B 37/042 257/415 |
| 7,156,720 B2 * | 1/2007 | Saito | ...................... | B24B 49/14 451/11 |
| 7,323,891 B2 * | 1/2008 | Kim | ..................... | G01R 31/311 324/750.03 |
| 7,365,828 B2 * | 4/2008 | Takamura | ........................ | 355/53 |
| 7,384,820 B2 * | 6/2008 | Munakata | ............. | H01L 21/561 257/E21.504 |
| 7,521,757 B2 * | 4/2009 | Kobayashi et al. | .......... | 257/335 |
| 7,579,216 B2 * | 8/2009 | Munakata | ............. | H01L 21/561 257/E21.505 |
| 7,705,969 B2 * | 4/2010 | Emoto | .................. | G03B 27/42 355/30 |
| 7,825,677 B2 * | 11/2010 | Takemoto | .......... | G01R 31/2886 324/762.02 |
| 7,846,346 B1 * | 12/2010 | Kawakami et al. | ............. | 216/44 |
| 7,875,501 B2 * | 1/2011 | Tanaka | ................. | B24B 37/042 257/E21.235 |
| 7,940,065 B2 * | 5/2011 | Yano et al. | ............... | 324/750.16 |
| 8,101,436 B2 * | 1/2012 | Takekoshi | ........... | B28D 5/0082 257/E21.214 |
| 8,212,345 B2 * | 7/2012 | Tanaka | ................. | B24B 37/042 257/678 |
| 8,702,891 B2 * | 4/2014 | Tange | ................. | H03H 9/1021 156/252 |
| 8,736,295 B2 * | 5/2014 | Watanabe | .......... | G01R 31/2889 324/73.1 |
| 8,789,263 B2 | 7/2014 | Kogure | | |
| 8,877,613 B2 * | 11/2014 | Munakata | ............. | H01L 21/561 257/E21.599 |
| 9,007,081 B2 * | 4/2015 | Ikegami | ............. | G01R 1/07314 257/337 |
| 2003/0077854 A1 * | 4/2003 | Teshirogi | ............. | B24B 37/042 438/113 |
| 2003/0077993 A1 | 4/2003 | Shimobeppu et al. | | |
| 2005/0035447 A1 * | 2/2005 | Basho et al. | ................. | 257/712 |
| 2005/0105243 A1 * | 5/2005 | Lee | .................... | H01L 21/6833 361/234 |
| 2005/0156166 A1 * | 7/2005 | Adachi | ............... | H01L 21/6838 257/48 |
| 2007/0063453 A1 * | 3/2007 | Ishikawa | ................. | B24B 37/30 279/3 |
| 2007/0094859 A1 * | 5/2007 | Lee | ........................ | B23P 21/006 29/33 K |
| 2007/0145992 A1 * | 6/2007 | Akahori | ............. | G01R 31/2893 324/750.19 |
| 2009/0121337 A1 * | 5/2009 | Abe | ................... | B23K 26/0057 257/686 |
| 2011/0095779 A1 * | 4/2011 | Washio | ............. | G01R 31/2887 324/756.05 |
| 2011/0277293 A1 | 11/2011 | Kogure | | |
| 2012/0077332 A1 * | 3/2012 | Abe | ................... | B23K 26/0057 438/460 |

FOREIGN PATENT DOCUMENTS

| | | | | |
|---|---|---|---|---|
| CN | 201876475 U | | 6/2011 | |
| CN | 102288790 A | | 12/2011 | |
| JP | 04264751 A * | | 9/1992 | |
| JP | 06013277 A * | | 1/1994 | ............. H01L 21/02 |
| JP | 08-019927 | | 1/1996 | |
| JP | 09-162269 | | 6/1997 | |
| JP | 11-111599 | * | 10/1997 | ........... H01L 21/027 |
| JP | 10193260 A * | | 7/1998 | |
| JP | EP 0850723 A1 * | | 7/1998 | ............. B24B 7/228 |
| JP | 2001-308075 | | 11/2001 | |
| JP | 2002036102 A * | | 2/2002 | |
| JP | 2001-308075 | * | 11/2002 | .......... H01L 21/3065 |
| JP | 2003-197581 | | 7/2003 | |
| JP | 2005-101488 A * | | 4/2005 | ......... H01L 12/027 |
| JP | 2006-86389 | * | 3/2006 | ............ H01L 21/683 |
| JP | 2006-135083 | | 5/2006 | |
| JP | 2006208208 A * | | 8/2006 | |
| JP | WO 2007/023746 * | | 1/2007 | ............ H01L 21/673 |
| JP | 2007088416 A * | | 4/2007 | |
| JP | 2008-004739 A | | 1/2008 | |
| JP | 2008-060307 | | 3/2008 | |
| JP | 2008-288485 | | 11/2008 | |
| JP | 2009-044008 | | 2/2009 | |
| JP | 2009-148868 | | 7/2009 | |
| JP | 2009-206417 | | 9/2009 | |
| JP | 2011-049337 A | | 3/2011 | |
| JP | 2012-076204 | | 4/2012 | |
| JP | 2001-251099 | * | 9/2014 | ............. H01L 21/52 |
| WO | WO 2007/023746 A1 * | | 1/2007 | ............ H01L 21/673 |
| WO | WO 2007/023746 A1 * | | 3/2007 | ............ H01L 21/673 |
| WO | WO 2013168196 A1 * | | 11/2013 | ........... G01R 1/0466 |

OTHER PUBLICATIONS

The First Office Action issued by the Patent Office of the People's Republic of China on Jun. 30, 2015, which corresponds to Chinese Patent Application No. 201310058056.8 and is related to U.S. Appl. No. 13/829,344; with English language partial translation.

Office Action issued by the Japanese Patent Office on Sep. 1, 2015, which corresponds to Japanese Patent Application No. 2012-150077 and is related to U.S. Appl. No. 13/829,344; with English language partial translation.

* cited by examiner

F I G . 3
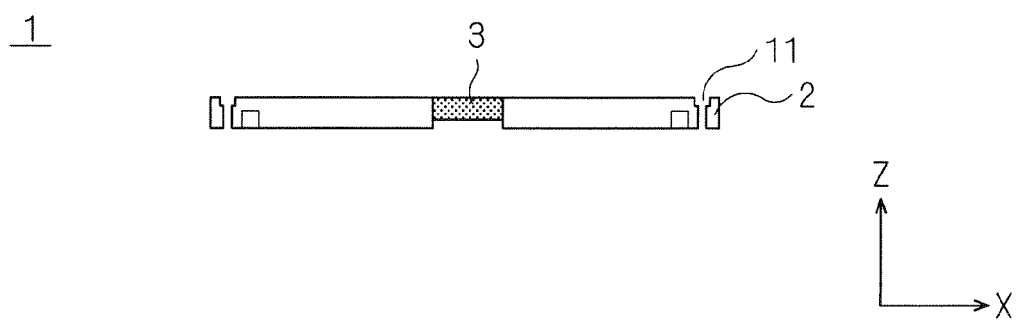

F I G. 5
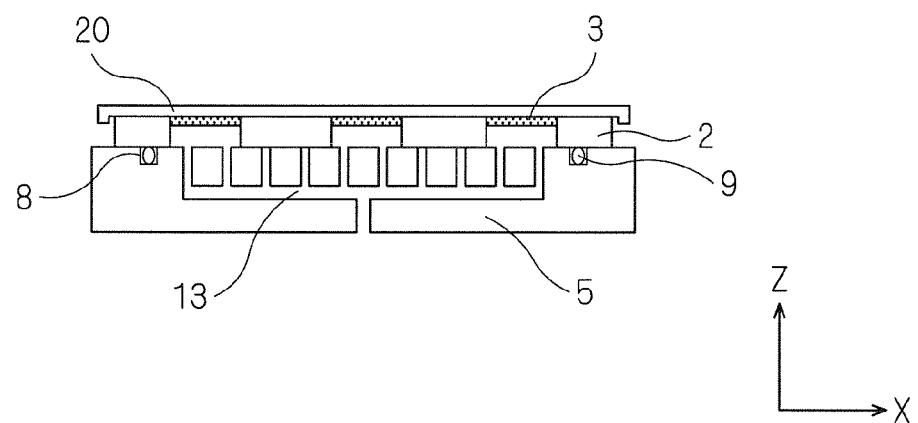
F I G. 6
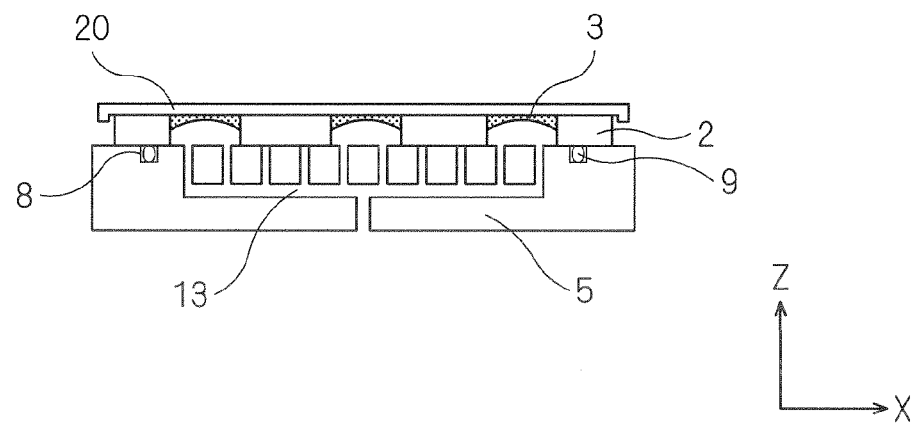

SEMICONDUCTOR TESTING JIG AND SEMICONDUCTOR TESTING METHOD PERFORMED BY USING THE SAME

BACKGROUND OF THE INVENTION

1. Field of the Invention

The present invention relates to a semiconductor testing jig and a semiconductor testing method performed by using the same.

2. Background Art

According to technique generally employed for measurement of the electrical characteristics of a semiconductor wafer or a semiconductor chip, for example, a surface of a measurement target where the measurement target is to be placed on a chuck stage is fixed under suction to the chuck stage. If the measurement target is a vertical semiconductor that flows a current in the vertical direction, namely, in the out-of-plane direction of the measurement target, how tightly the measurement target and the chuck stage contact each other affects a contact resistance, and eventually, affects the electrical characteristics of the measurement target.

However, increasing the tightness of contact for reducing the contact resistance, namely, increasing a degree of vacuum of the vacuum suction in turns degrades electrical characteristics. If a foreign matter such as dust exists on the chuck stage, the measurement target is placed on the foreign matter and the surface of the measurement target where the measurement target is placed on the chuck stage is pressed strongly against the foreign matter under vacuum suction. If the foreign matter has a large size, a defect such as a crack is generated in a contact part with the measurement target and the vicinity of the contact part, so that the measurement target is damaged partially. The damaged measurement target is counted as a defective. Meanwhile, even if the foreign matter has a relatively small size such as tens of µm or less that is hard to recognize visually, distortion due to pressure is still generated in the measurement target in the contact part with the measurement target and the vicinity of the contact part. This generates the piezoelectric effect to increase a leakage current, so that the measurement target is also counted as a defective (see Japanese Patent Application Laid-Open No. 2008-4739).

For purposes such as enhancement of electrical characteristics, reduction of the thickness of a semiconductor wafer has been in progress in recent years. The semiconductor wafer is held on the chuck stage under vacuum suction through a vacuum suction groove formed in the chuck stage. Increasing a degree of vacuum of the vacuum suction sucks the semiconductor wafer easily into the vacuum suction groove, especially if the semiconductor wafer is a thin wafer. Hence, part of the thin wafer existing near the vacuum suction groove is deformed to generate distortion. If a contact probe to make electrical contact for measuring electrical characteristics is brought into contact with the semiconductor wafer existing on the vacuum suction groove, the semiconductor wafer is also deformed due to contact pressure from the probe, thereby generating distortion.

Japanese Patent Application Laid-Open No. 2008-4739 describes technique as a remedy for increase of a fraction defective due to a foreign matter on the chuck stage. According to this technique, a stress buffering film is provided on the rear surface of a semiconductor substrate to relax stress applied by the foreign matter. Japanese Patent Application Laid-Open No. 2011-49337 also describes technique of providing a conductive and elastic sheet on the rear surface of a semiconductor substrate, and removing the sheet after manufacturing steps and evaluating steps.

According to the techniques described in Japanese Patent Application Laid-Open Nos. 2008-4739 and 2011-49337, a film or a sheet is provided on a semiconductor substrate targeted for a test of electrical characteristics by a semiconductor testing device to relax stress on the semiconductor substrate due to a foreign matter, thereby reducing a fraction defective. Providing the film or the sheet for stress relaxation also makes it possible to alleviate deformation of a semiconductor wafer due to the vacuum suction groove.

However, providing a film or a sheet to all semiconductor substrates targeted for measurement leads to the problem of cost increase as it involves more manufacturing steps and an additional material.

Reducing the width of the vacuum suction groove may be a different way of suppressing distortion of a semiconductor substrate. However, the minimum possible width is about some hundred micrometers in consideration of restraints on processing of the vacuum suction groove. So, the width cannot be reduced sufficiently enough to suppress deformation especially of a thin semiconductor wafer. Additionally, reducing the width of the vacuum suction groove is additional work on an existing check stage, so that it involves interruption of a testing step and eventually, interruption of manufacturing steps. This acts disadvantageously in terms of cost.

SUMMARY OF THE INVENTION

It is an object of the present invention to provide a semiconductor testing jig that suppresses generation of distortion due to a vacuum suction hole or contact pressure from a contact probe, and a semiconductor testing method performed by using the same.

The semiconductor testing jig of the present invention fixes a measurement target while it is held between a chuck stage and the measurement target. The semiconductor testing jig of the present invention includes a base on which the measurement target is to be installed and which can be attached to the chuck stage. The base includes a first main surface, a second main surface opposite the first main surface, and a porous region. The first main surface becomes an installation surface for the measurement target. The second main surface is to contact the chuck stage. The porous region contains a porous member, is provided selectively as seen in plan view, and penetrates through the base from the first main surface toward the second main surface.

The diameter of the porous member is smaller than that of a conventional vacuum suction groove. Thus, generation of distortion in a wafer due to vacuum suction force or contact pressure from a contact probe can be suppressed.

These and other objects, features, aspects and advantages of the present invention will become more apparent from the following detailed description of the present invention when taken in conjunction with the accompanying drawings.

BRIEF DESCRIPTION OF THE DRAWINGS

FIG. 3 is a sectional view of the semiconductor testing jig of the first preferred embodiment;

FIGS. 5 and 6 are sectional views each showing a semiconductor testing jig of a modification of the first preferred embodiment;

EMBODIMENT FOR CARRYING OUT THE INVENTION

A. First Preferred Embodiment

A-1. Structure

Figure 1:
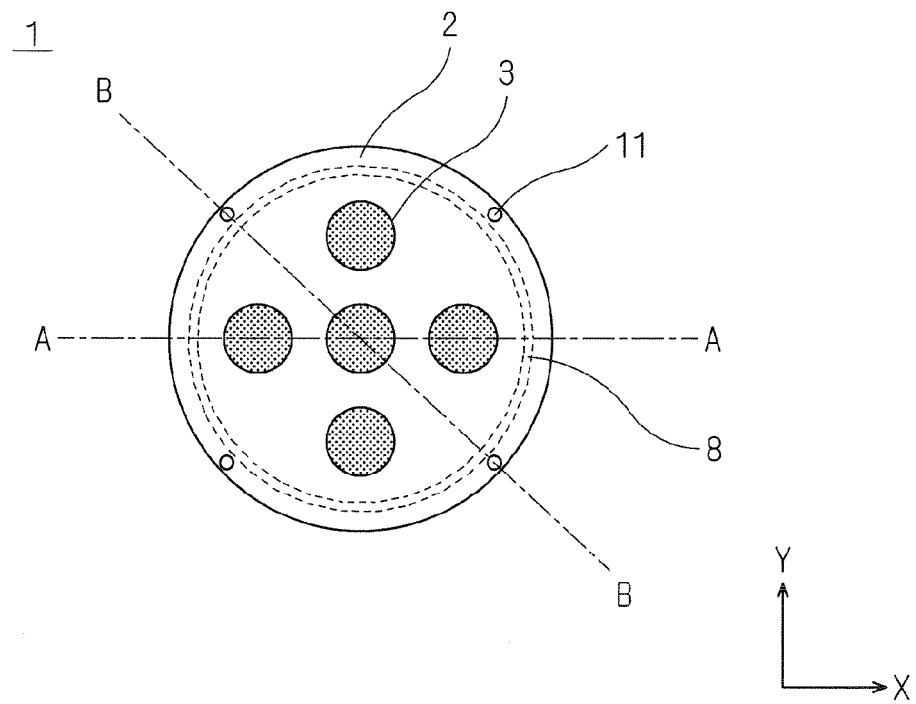
FIG. 1 is a top view of a semiconductor testing jig of a first preferred embodiment.
Figure 2:
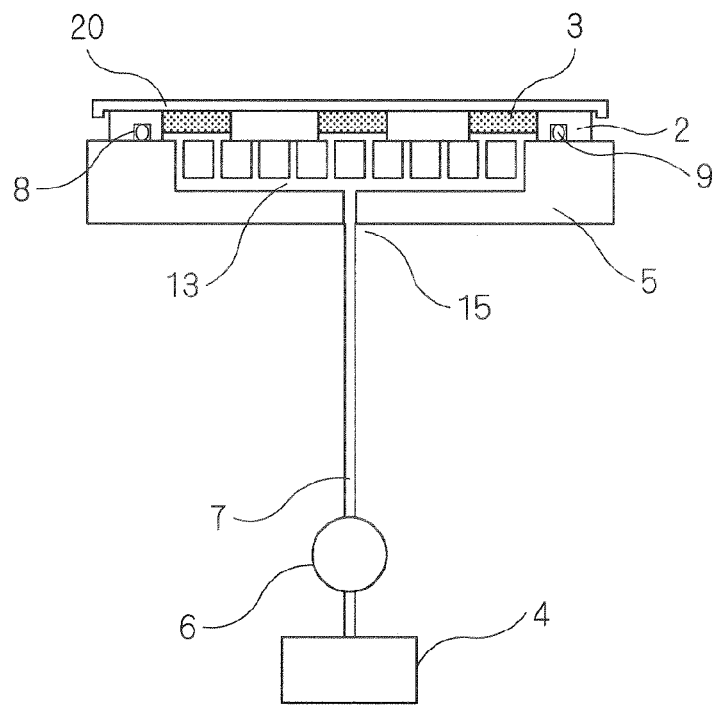
FIG. 2 shows the structure of a semiconductor testing device including the semiconductor testing jig of the first preferred embodiment.

FIG. 1 is a top view of a semiconductor testing jig 1 of a first preferred embodiment. FIG. 2 is a sectional view taken along line A-A of FIG. 1 and showing a semiconductor testing device including the semiconductor testing jig 1. FIG. 3 is a sectional view taken along line B-B of FIG. 2 and showing the semiconductor testing jig 1.

As shown in FIG. 2, the semiconductor testing device of the first preferred embodiment includes a chuck stage 5 for vacuum suction, the semiconductor testing jig 1 placed on an installation surface of the chuck stage 5, a vacuum path 7 connected to a connection hole 15 of the chuck stage 5, a regulator 6 connected to the vacuum path 7, and a vacuum source 4.

The chuck stage 5 is an existing vacuum suction stage, and has a suction path 13 inside communicating with the connection hole 15. The suction path 13 communicates with an opening of the installation surface of the chuck stage 5.

The vacuum source 4 is a vacuum pump provided for each semiconductor testing device or for a plurality of semiconductor testing devices, for example, and performs evacuation during vacuum suction. The vacuum source 4 is placed for example in a factor, and may perform evacuation of a plurality of devices or facilities collectively.

The regulator 6 sets a degree of vacuum of vacuum suction at a stable value. If the vacuum source 4 performs evacuation of a plurality of components or facilities collectively, a degree of vacuum may vary widely. Provision of the regulator 6 is required particularly in such a case.

When the vacuum source 4 is driven to evacuate the suction path 13, the opening of the installation surface of the chuck stage 5 becomes a vacuum suction hole to fix a target on the installation surface.

The semiconductor testing jig 1 includes a base 2 in the form of a circular plate on which a measurement target 20 is to be installed. The base 2 has a first main surface to become an installation surface for the measurement target 20, and a second main surface to become a contact surface with the chuck stage 5. Porous regions are formed selectively in the base 2 as seen in plan view. The porous regions penetrate through the base 2 from the first main surface toward the second main surface, and porous members 3 extend from the first main surface toward the second main surface to fill in the porous regions to a predetermined depth. The porous members 3 function as vacuum suction holes for the measurement target 20 when the suction path 13 is evacuated. Thus, the porous member 3 may be provided in at least one place of the semiconductor testing jig 1. Meanwhile, if the porous members 3 are provided in a plurality of places at substantially regular intervals, the measurement target 20 can be sucked stably at the plurality of places. FIG. 1 shows an example where the porous members 3 are formed in five places of the semiconductor testing jig 1.

The porous members 3 are made of a material selected from aluminum, titanium, zinc, iron, cobalt, nickel, tin, copper, silver, rhodium, palladium, platinum and gold, and compounds and multilayer structures of these materials. The porous members 3 are manufactured mainly by metal powder injection molding (MIM). To be specific, the base 2 is settled in a molding die in which spaces to be filled with porous members are formed in advance, and metal powder is injection molded. Then, a pressing step and a sintering step are performed to form the base 2 and the porous members 3 integrally.

Fixing holes 11 are provided in four places of the outer circumference of the base 2. The semiconductor testing jig 1 is fixed to the chuck stage 5 by being screwed through the fixing holes 11. As shown in FIG. 3, the fixing holes 11 are countersunk through holes, so that parts of screws do not project from above a surface of the base 2 during the screw fixation. The number of the fixing holes 11 is not limited to that shown in FIG. 1. Meanwhile, it is preferable that the semiconductor testing jig 1 be screwed at places arranged at substantially regular intervals in order to avoid nonuniform application of force on an O-ring 9 described later.

The contact surface of the chuck stage 5 to be in contact with the base 2 is provided with an O-ring groove 8 circling along the outer circumference of the base 2. The O-ring 9 is fitted in the O-ring groove 8, thereby connecting the semiconductor testing jig 1 and the chuck stage 5 through the O-ring 9. Forming contact between the semiconductor testing jig 1 and the chuck stage 5 through the O-ring 9 prevents vacuum leak, thereby allowing enhancement of efficiency in vacuum suction.

A-2. Semiconductor Test

Figure 4:
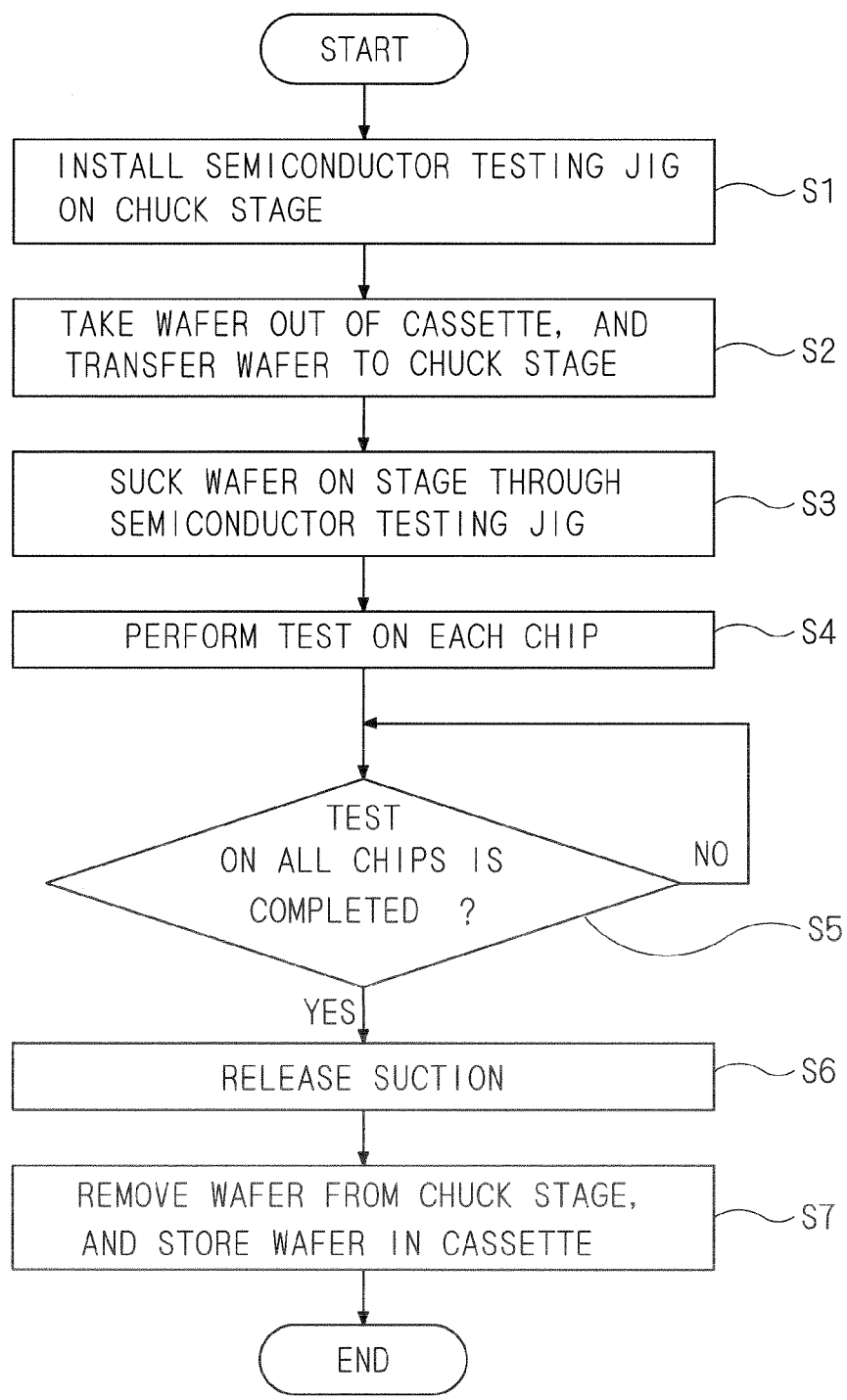
FIG. 4 is a flowchart explaining a semiconductor testing method of the first preferred embodiment.

A procedure of a semiconductor test performed by using the semiconductor testing jig 1 is explained by referring to the flowchart of FIG. 4. First, the semiconductor testing jig 1 is installed on the chuck stage 5 (step S1). Here, the O-ring 9 is fitted in the O-ring groove 8 of the semiconductor testing jig 1, and then the semiconductor testing jig 1 is screwed through the fixing holes 11, thereby fixing the semiconductor testing jig 1 to the chuck stage 5.

Next, the measurement target 20 (wafer) is taken out of a cassette, and is transferred to the chuck stage 5 (step S2). To be specific, the measurement target 20 is installed on the semiconductor testing jig 1 on the chuck stage 5.

After placing the measurement target 20, vacuum suction is generated to fix the measurement target 20 to the semiconductor testing jig 1 on the chuck stage 5 (step S3). At this time, desirable vacuum pressure is set by the regulator 6. The vacuum suction is generated through the porous members 3 of the semiconductor testing jig 1. The diameter of the porous material such as 10 μm or less is some orders of magnitude smaller than the width of a vacuum suction groove of a conventional chuck stage. This suppresses deformation and distortion of the wafer due to the vacuum suction force. Further, the aforementioned diameter is smaller than the size of a contact part of a contact probe used in measuring electric characteristics. This also makes it possible to suppress deformation and distortion of the wafer due to contact pressure from the contact probe.

The thickness of the porous members 3 can be changed according to a distance from the connection hole 15. More specifically, a porous member 3 nearest the connection hole 15 is set to have a great thickness, and a porous member 3 farthest from the connection hole 15 is set to have a small thickness. This allows all the porous members 3 to have the same vacuum conductance.

Next, measurement of electrical characteristics is started under vacuum suction. As an example, a test is performed on each chip (step S4). If the test on all chips is completed (if determined to be Yes in step S5), the vacuum suction is released (step S6). Then, the measurement target 20 (wafer) is moved from the chuck stage 5 (step S7), and is stored for example in a cassette.

In the first preferred embodiment, vacuum suction is generated through the porous members 3. Hence, vacuum pressure is not necessarily required to be variable. However, if the measurement target 20 is a thin wafer and is sucked under excessive vacuum pressure, it may become hard to attach and detach the measurement target 20 to and from the semiconductor testing jig 1. Hence, it is desirable that vacuum pressure be managed properly.

A-3. Modifications

FIG. 5 shows a semiconductor testing jig 1 and a chuck stage 5 of a first modification of the first preferred embodiment. In the first modification, the O-ring groove 8 is not provided in the semiconductor testing jig 1 but in the chuck stage 5. Further, the porous members 3 is smaller in thickness than the porous members 3 of FIG. 3. The structures of the semiconductor testing jig 1 and the chuck stage 5 of the first modification are the same in other respects as those of the semiconductor testing jig 1 and the chuck stage 5 of FIGS. 1 to 3.

Regarding vacuum suction, it is desirable that vacuum pressure be managed properly in response to the thickness of the measurement target 20. The vacuum pressure may be adjusted by the regulator 6, or in response to the thickness of the porous member 3. To be specific, a plurality of semiconductor testing jigs 1 with porous members 3 of different thicknesses is prepared, and a semiconductor testing jig 1 including a porous member 3 of a proper thickness is selected and used in response to the thickness of the measurement target 20. The semiconductor testing jig 1 of FIG. 5 includes the porous members 3 smaller in thickness than the porous members 3 of FIG. 3. The example of FIG. 5 shows that vacuum pressure is increased in response to a thick measurement target 20.

If a plurality of semiconductor testing jigs 1 is to be used properly according to the thickness of the measurement target 20, processing cost is increased by forming the O-ring groove 8 in each of the semiconductor testing jigs 1. In contrast, providing the O-ring groove 8 in the chuck stage 5 does not increase manufacturing cost as it involves only one processing on the chuck stage 5.

FIG. 6 shows a semiconductor testing jig 1 and a chuck stage 5 of a second modification of the first preferred embodiment. In the second modification, surfaces of the porous members 3 facing the chuck stage 5 are formed into curved surfaces (in the form of an arch). More specifically, the porous members 3 have concave surfaces. The structures of the semiconductor testing jig 1 and the chuck stage 5 of the second modification are the same in other respects as those of the semiconductor testing jig 1 and the chuck stage 5 of FIGS. 1 to 3, so that they will not be described again.

The structure of the semiconductor testing jig 1 of the second modification shown in FIG. 6 disperses downward force along the arch surfaces to be applied during suction of the measurement target 20, so that the durability of the semiconductor testing jig 1 is enhanced.

A-4. Effects

The semiconductor testing jig 1 of the present invention fixes the measurement target 20 while it is held between the chuck stage 5 and the measurement target 20. The semiconductor testing jig 1 includes the base 2 on which the measurement target 20 is to be installed and which can be attached to the chuck stage 5. The base 2 has the first main surface to become an installation surface for the measurement target 20, the second main surface opposite the first main surface and which is to contact the chuck stage 5, and the porous region containing the porous member 3. The porous region is provided selectively as seen in plan view, and penetrates through the base 2 from the first main surface toward the second main surface. The porous member 3 of the semiconductor testing jig 1, to become a vacuum suction hole for fixation of the measurement target 20, has a diameter of for example 10 µm or less smaller than that of a vacuum suction groove of a conventional chuck stage. This suppresses distortion of the measurement target 20 due to vacuum suction force. Further, the diameter of the porous member 3 is smaller than a contact area of a contact probe. This also suppresses distortion of the measurement target 20 due to contact pressure from the contact probe. Additionally, no additional member is required for each wafer or each chip to become the measurement target 20, so that manufacturing cost can be cut down. Manufacturing cost can also be cut down as an existing chuck stage can be used as the chuck stage 5.

The porous member 3 extends from the first main surface toward the second main surface to fill in the porous region to a predetermined depth. Controlling the depth of the porous member 3 allows adjustment of vacuum suction force to be applied on the measurement target 20. As a result, vacuum suction force responsive to the thickness of the measurement target 20 can be obtained.

If the porous region includes porous regions filled with the porous member 3 and provided in a plurality of places, the measurement target 20 can be fixed to the semiconductor testing jig 1 at the plurality of places. In particular, the measurement target 20 can be fixed reliably if the porous regions are arranged at substantially regular intervals in the semiconductor testing jig 1 as seen in plan view.

A uniform vacuum conductance can be achieved by increasing the thickness of the porous member 3 with smaller distances of the porous regions from the center of the base 2.

The second main surface of the semiconductor testing jig 1 includes the O-ring groove 8 in which the O-ring 9 is to be fitted. This prevents vacuum leak between the semiconductor testing jig 1 and the chuck stage 5 to enhance efficiency in vacuum suction.

The porous region filled with the porous member 3 has a surface facing the second main surface and formed into a concave shape. Thus, downward force to be applied on the semiconductor testing jig 1 during suction of the measurement target 20 is dispersed along the arch surface, so that the durability of the semiconductor testing jig 1 is enhanced.

A semiconductor testing method of the first preferred embodiment is performed by using the semiconductor testing jig 1 of the first preferred embodiment. The semiconductor testing method includes the steps of: (a) placing the semiconductor testing jig 1 on the chuck stage 5; (b) placing the measurement target 20 on the semiconductor testing jig 1; (c) vacuum sucking the measurement target 20 onto the semiconductor testing jig 1; and (d) measuring the electrical characteristics of the measurement target 20. The porous member 3 of the semiconductor testing jig 1 to become a vacuum suction hole has a diameter of for example 10 µm or less smaller than that of a vacuum suction groove of a conventional chuck stage. This suppresses distortion of the measurement target 20 due to vacuum suction force. Further, the diameter of the porous member 3 is smaller than a contact area of a contact probe. This also suppresses distortion of the measurement target 20 due to contact pressure from the contact probe. Additionally, no additional member is required for each wafer or each chip to become the measurement target 20, so that manufacturing cost can be cut down. Manufacturing cost can also be cut down as an existing chuck stage can be used as the chuck stage 5.

The semiconductor testing method further includes steps (e) and (f) performed before the step (a). In the step (e), a plurality of semiconductor testing jigs 1 with the porous members 3 of different thicknesses to fill in the porous regions is prepared. In the step (f), one of the semiconductor testing jigs 1 is selected in response to the thickness of the measurement target 20. As a result, vacuum suction force responsive to the thickness of the measurement target 20 can be obtained.

B. Second Preferred Embodiment

B-1. Structure

Figure 7:
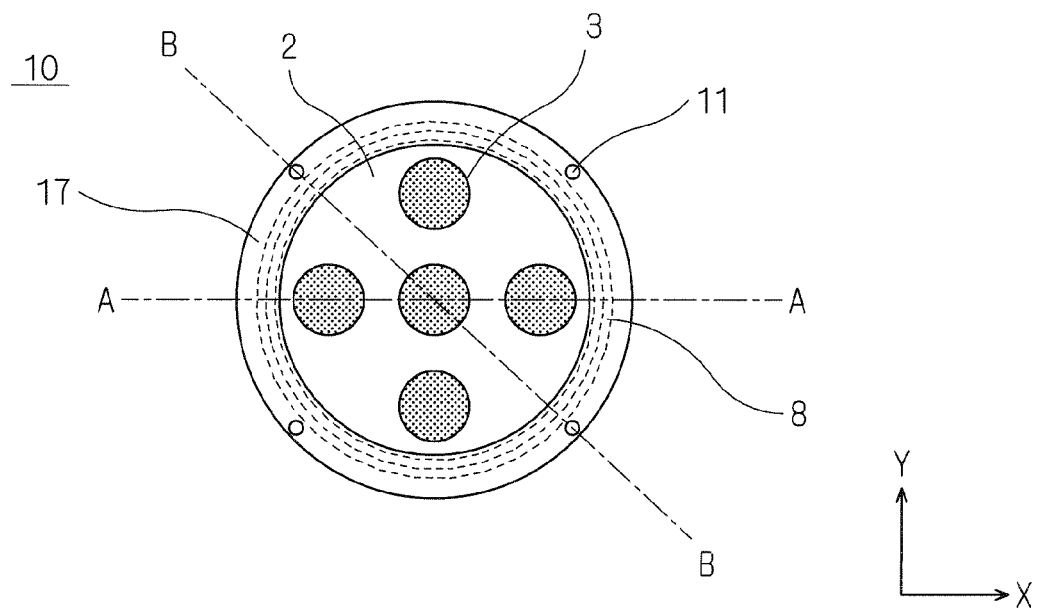
FIG. 7 is a top view of a semiconductor testing jig of a second preferred embodiment.
Figure 8:
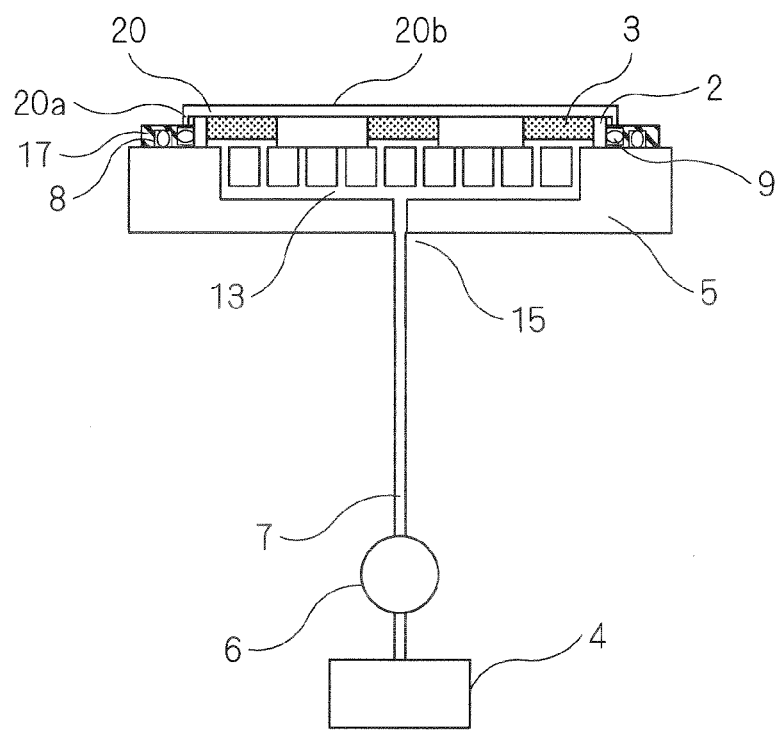
FIG. 8 shows the structure of a semiconductor testing device including the semiconductor testing jig of the second preferred embodiment.
Figure 9:
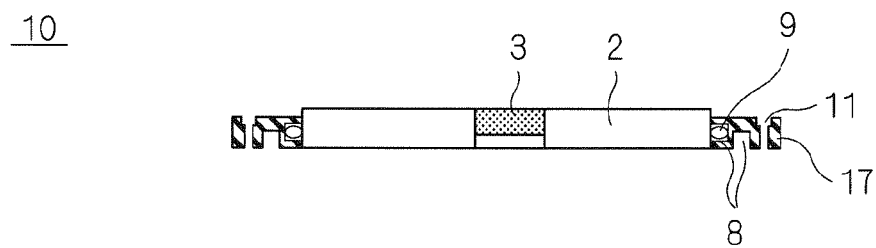
FIGS. 9 and 10 are sectional views each showing the semiconductor testing jig of the second preferred embodiment.

FIG. 7 is a top view of a semiconductor testing jig 10 of a second preferred embodiment. FIG. 8 is a sectional view taken along line A-A of FIG. 7 and showing a semiconductor testing device including the semiconductor testing jig 10. FIG. 9 is a sectional view taken along line B-B of FIG. 7 and showing the semiconductor testing jig 10.

As shown in FIG. 7, the semiconductor testing jig 10 includes a base 2, and an annular auxiliary member 17 attached to a side surface of the base 2 so as to surround the base 2. The auxiliary member 17 includes two O-ring grooves 8. One of the O-ring grooves 8 is formed in a surface of the auxiliary member 17 contacting the side surface of the base 2, and receives an O-ring 9 fitted therein, thereby preventing vacuum leak between the auxiliary member 17 and the base 2. The other of the O-ring grooves 8 is formed in a surface of the auxiliary member 17 to contact the chuck stage 5, and receives an O-ring 9 to be fitted therein, thereby preventing vacuum leak between the auxiliary member 17 and the chuck stage 5. Hence, unlike the semiconductor testing jig 1, the O-ring groove 8 is not formed in the base 2.

Except for the auxiliary member 17, the structure of the semiconductor testing jig 10 is the same as that of the semiconductor testing jig 1, so that it will not be described again.

The auxiliary member 17 is smaller in thickness than the base 2. Thus, a step is generated between a first main surface of the base 2 and the upper surface of the auxiliary member 17 while the auxiliary member 17 is attached to the base 2. The height of this step is determined in response to a step between a rim part 20a and a thin part 20b of a measurement target 20, so that the rim part 20a of the measurement target 20 can be supported by the upper surface of the auxiliary member 17.

If the auxiliary member 17 to support the rim part 20a is not provided, the thin part 20b may be deflected by the load of the rim part 20a, generating the fear of deformation and distortion of a wafer. This problem is alleviated by the presence of the auxiliary member 17. To be specific, the semiconductor testing jig 10 of the second preferred embodiment is suitably applied especially in the case where the measurement target 20 has the rim part 20a and the thin part 20b.

Figure 10:
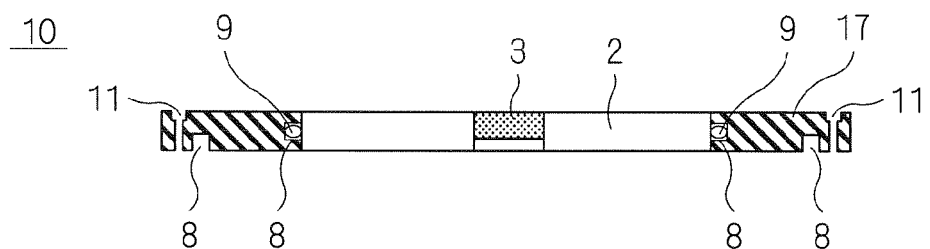

If the measurement target 20 is a wafer without the rim part 20a, the auxiliary member 17 may be set to have the same height as the base 2 as shown in FIG. 10. In this case, even a wafer larger than the semiconductor testing jig 10 can be supported stably to alleviate the problem of deformation and distortion of the wafer.

The auxiliary member 17 can be attached and detached to and from the base 2 through the O-rings 9. Thus, measurement targets 2 of different sizes can be handled by attaching and detaching the auxiliary member 17 without the need of changing the size of the semiconductor testing jig 10 itself. The auxiliary member 17 may be made of a light and dimensionally-stable resin material such as a PPS resin. However, this is not the only example but the auxiliary member 17 may be made of a dimensionally-stable metal. The auxiliary member 17 is provided with the O-ring grooves 8. Thus, it is desirable that the auxiliary member 17 be made of a dimensionally-stable material.

B-2. Modifications

Figure 11:
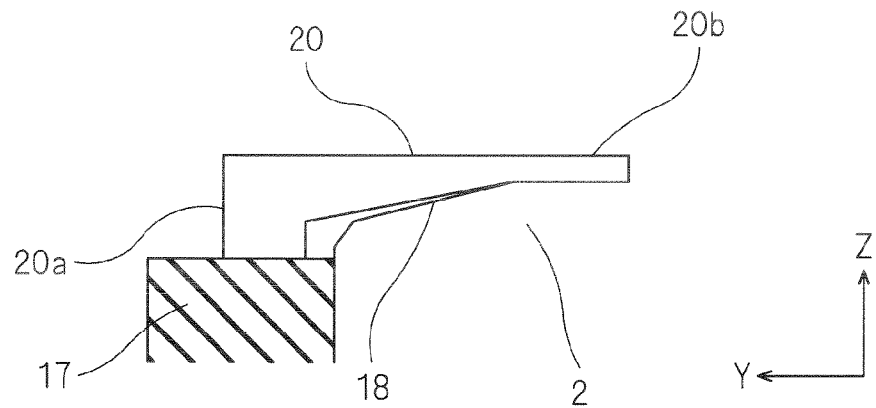
FIG. 11 is a sectional view showing principal part of a semiconductor testing jig of a modification of the second preferred embodiment.

FIG. 11 is a sectional view showing principal part of a semiconductor testing jig 10 of a modification of the second preferred embodiment. In the semiconductor testing jig 10 of this modification, an end neighboring part 18 of the first main surface of the base 2 to contact the measurement target 20 is beveled. The structure of the semiconductor testing jig 10 of this modification is the same in other respects as that of the semiconductor testing jig 10 described by referring to FIGS. 7 to 10, so that it will not be described again.

The semiconductor testing jig 10 of this modification is suitably applied to a thin wafer having the rim part 20a. Such a thin wafer is gradually reduced in thickness at a boundary area between the rim part 20a and the thin part 20b and in a direction from the rim part 20a toward the thin part 20b. Hence, if the first main surface of the base 2 is a flat surface, the measurement target 20 is warped upward in a place contacting the end neighboring part 18 to generate distortion of the measurement target 20.

Thus, the end neighboring part 18 is beveled in response to the shape of the measurement target 20 to suppress generation in a wafer due to deformation thereof.

B-3. Effects

In the semiconductor testing jig 10 of the modification of the second preferred embodiment, the end neighboring part 18 of the first main surface of the base 2 is beveled. Thus, if the measurement target 20 is a wafer having the rim part 20a, a boundary area between the rim part 20a and the thin part 20b does not contact the base 2 so that the measurement target 20 is not warped upward. As a result, generation of distortion in the measurement target 20 is suppressed.

The semiconductor testing jig 10 of the second preferred embodiment includes the auxiliary member 17 attached to the side surface of the base 2 so as to surround the base 2. If the auxiliary member 17 is the same in thickness as the base 2, a measurement target 20 larger than the base 2 can be installed on the base 2. Further, by preparing auxiliary members 17 of various sizes, measurement targets 2 of different sizes can be handled while the base 2 is used as it is. Meanwhile, if the auxiliary member 17 is to be different in thickness from the base 2, the thickness of the auxiliary member 17 is determined in response to the step between the rim part 20a and the thin part 20b of the measurement target 20, for example. As a result, the rim part 20a can be supported by the auxiliary member 17. As a result, the thin part 20b may not be deflected by the load of the rim part 20a, so that generation of distortion in the measurement target 20 is suppressed.

The auxiliary member 17 includes the O-ring groove 8 formed in the surface of the auxiliary member 17 to contact the chuck stage 5. This prevents vacuum leak between the auxiliary member 17 and the chuck stage 5 to enhance efficiency in vacuum suction.

The preferred embodiments of the present invention can be combined freely, and each of the preferred embodiments can be modified or omitted where appropriate without departing from the scope of the invention.

While the invention has been shown and described in detail, the foregoing description is in all aspects illustrative and not restrictive. It is therefore understood that numerous modifications and variations can be devised without departing from the scope of the invention.

What is claimed is:

1. A semiconductor testing jig that fixes a measurement target while it is held between a chuck stage and said measurement target,
   the semiconductor testing jig comprising a base on which said measurement target is to be installed and which can be attached to said chuck stage,
   the base including:
   a first main surface to become an installation surface for said measurement target;
   a second main surface opposite said first main surface and which is to contact said chuck stage;
   a plurality of porous regions each containing a porous member, the porous regions being provided selectively as seen in plan view, and penetrating through said base from said first main surface toward said second main surface; and
   a nonporous region provided between said plurality of porous regions as seen in plan view.

2. The semiconductor testing jig according to claim 1, wherein each porous member extends from said first main surface toward said second main surface to fill in each porous region to a predetermined depth.

3. The semiconductor testing jig according to claim 1, wherein the thickness of each porous member is increased with smaller distances of said porous regions from the center of said base.

4. The semiconductor testing jig according to claim 1, wherein said second main surface includes an O-ring groove in which an O-ring is to be fitted.

5. The semiconductor testing jig according to claim 1, wherein each porous region filled with said porous member has a surface facing said second main surface and formed into a concave shape.

6. A semiconductor testing jig that fixes a measurement target while it is held between a chuck stage and said measurement target,
   the semiconductor testing jig comprising a base on which said measurement target is to be installed and which can be attached to said chuck stage,
   the base including:
   a first main surface to become an installation surface for said measurement target;
   a second main surface opposite said first main surface and which is to contact said chuck stage; and
   a porous region containing a porous member, the porous region being provided selectively as seen in plan view, and penetrating through said base from said first main surface toward said second main surface,
   wherein an end neighboring part of said first main surface of said base is beveled.

7. A semiconductor testing jig that fixes a measurement target while it is held between a chuck stage and said measurement target,
   the semiconductor testing jig comprising a base on which said measurement target is to be installed and which can be attached to said chuck stage,
   the base including:
   a first main surface to become an installation surface for said measurement target;
   a second main surface opposite said first main surface and which is to contact said chuck stage;
   a porous region containing a porous member, the porous region being provided selectively as seen in plan view, and penetrating through said base from said first main surface toward said second main surface; and
   an auxiliary member attached to a side surface of said base so as to surround the base.

8. The semiconductor testing jig according to claim 7, wherein said auxiliary member is different in thickness from said base.

9. The semiconductor testing jig according to claim 1, further comprising an auxiliary member attached to a side surface of said base so as to surround the base,
   wherein said auxiliary member includes an O-ring groove in which an O-ring is to be fitted, the O-ring groove being formed in a surface of said auxiliary member to contact said chuck stage.

10. A semiconductor testing method performed by using a semiconductor testing jig that fixes a measurement target while it is held between a chuck stage and said measurement target,
    the semiconductor testing jig comprising a base on which said measurement target is to be installed and which can be attached to said chuck stage,
    the base including:
    a first main surface to become an installation surface for said measurement target;
    a second main surface opposite said first main surface and which is to contact said chuck stage; and
    a porous region containing a porous member, the porous region being provided selectively as seen in plan view, and penetrating through said base from said first main surface toward said second main surface;
    the semiconductor testing method comprising the steps of:
    (a) installing said semiconductor testing jig on said chuck stage;
    (b) installing said measurement target on said semiconductor testing jig;
    (c) vacuum sucking said measurement target onto said semiconductor testing jig; and
    (d) measuring the electrical characteristics of said measurement target.

11. The semiconductor testing method according to claim 10, further comprising the steps of
    (e) preparing a plurality of said semiconductor testing jigs with porous members of different thicknesses to fill in porous regions, the step (e) being performed before said step (a), and (f) selecting one of said semiconductor testing jigs in response to the thickness of said measurement target, the step (f) being performed before said step (a).

\* \* \* \* \*